United States Patent [19]

Takahashi

[11] Patent Number: 4,889,786

[45] Date of Patent: Dec. 26, 1989

[54] LIGHT-SENSITIVE MATERIAL CONTAINING SILVER HALIDE, REDUCING AGENT POLYMERIZABLE COMPOUND AND COLOR FORMING SYSTEM AND COMPRISING MICROCAPSULES HAVING DIFFERENT MEAN GRAIN SIZES

[75] Inventor: Ryuichi Takahashi, Kanagawa, Japan

[73] Assignee: Fuji Photo Film Co., Ltd., Kanagawa, Japan

[21] Appl. No.: 183,955

[22] Filed: Apr. 20, 1988

[30] Foreign Application Priority Data

Apr. 20, 1987 [JP] Japan .................................. 62-96802

[51] Int. Cl.$^4$ .......................... G03C 1/72; B41M 5/12
[52] U.S. Cl. .................................... 430/138; 430/281; 427/150; 428/402.2; 428/402.24
[58] Field of Search ................ 430/138, 281; 503/221; 427/150; 428/402.2, 402.24

[56] References Cited

U.S. PATENT DOCUMENTS

| | | | |
|---|---|---|---|
| 4,629,676 | 12/1986 | Hayakawa et al. | 430/203 |
| 4,735,884 | 4/1988 | Tsukahara et al. | 430/138 |
| 4,758,496 | 7/1988 | Kakimi | 430/138 |
| 4,760,011 | 7/1988 | Kakimi | 430/138 |
| 4,775,656 | 10/1988 | Harada et al. | 503/221 |
| 4,782,002 | 11/1988 | Makino et al. | 430/138 |
| 4,792,514 | 12/1988 | Nakamura et al. | 430/138 |
| 4,800,148 | 1/1989 | Harada et al. | 430/138 |

FOREIGN PATENT DOCUMENTS

| | | | |
|---|---|---|---|
| 0203613 | 12/1986 | European Pat. Off. | 430/138 |
| 0234580 | 9/1987 | European Pat. Off. | 430/138 |
| 0251203 | 1/1988 | European Pat. Off. | 430/138 |

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

A light-sensitive material comprises a light-sensitive layer provided on a support wherein the light-sensitive layer contains a silver halide, a polymerizable compound, a reducing agent and two components which give a color in contact with each other. One of the components, the silver halide and the polymerizable compound, are together contained in one microcapsule to form a light-sensitive microcapsule. The other component is contained in other microcapsule(s). A mean particle size of the microcapsule containing the other component is larger than that of the light-sensitive microcapsule.

12 Claims, No Drawings

LIGHT-SENSITIVE MATERIAL CONTAINING SILVER HALIDE, REDUCING AGENT POLYMERIZABLE COMPOUND AND COLOR FORMING SYSTEM AND COMPRISING MICROCAPSULES HAVING DIFFERENT MEAN GRAIN SIZES

FIELD OF THE INVENTION

This invention relates to a light-sensitive material comprising a light-sensitive layer which contains a silver halide, a reducing agent, a polymerizable compound and a color image forming substance provided on a support, and further relates to a mono-sheet type light-sensitive material comprising a light-sensitive layer which contains the above components in the form of microcapsules.

BACKGROUND OF THE INVENTION

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publications Nos. 57(1982)-138632, 57(1982)142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time.

An improved image forming method employing a dry process is described in Japanese Patent Provisional Publications Nos. 61(1986)-69062 and 61(1986)-73145 (the contents of both publications are described in U.S. Pat. No. 4,629,676). In this image forming method, a recording material (i.e., light-sensitive material) comprising a light-sensitive layer containing a light-sensitive silver salt (i.e., silver halide), a reducing agent, a crosslinkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publications Nos. 61(1986)-183640, 61(1986)-188535 and 61(1986)-228441.

The above-mentioned image forming methods are based on the principle in which the polymerizable compound is polymerized in the portion where a latent image of the silver halide has been formed.

Further, Japanese Patent Provisional Publication No. 61(1986)-260241 describes another image forming method in which the polymerizable compound in a portion where a latent image of the silver halide has not been formed is polymerized. In the method, when the material is heated, the reducing agent functions as polymerization inhibitor in the portion where a latent image of the silver halide has been formed, and the polmerizable compound in the other portion is polymerized.

Japanese Patent Provisional Publication No. 61(1986)-275742 describes an embodiment of the light-sensitive material, which employs microcapsules containing at least two components of the light-sensitive layer, that is polymerizable compound and a color image forming substance. The light-sensitive material having such a structure can be utilized in a color formation system utilizing a reaction between two components. One component of the color image forming substances can be separated from the other component by being contained in microcapsule. The light-sensitive material can be constituted as a mono-sheet type light-sensitive material which employs two components co-existed in the light-sensitive layer. Therefore, an image formation procedure can be simplified and a color image can be obtained easily.

SUMMARY OF THE INVENTION

An object of the present invention is to provide a light-sensitive material which gives a clear color image in a simple procedure.

Another object of the invention is to provide a light-sensitive material which is improved in preservability.

There is provided by the present invention a light-sensitive material comprising a light-sensitive layer containing silver halide, a polymerizable compound, a reducing agent and two components which give a color in contact with each other provided on a support, wherein the one component, the silver halide and the polymerizable compound are together contained in one microcapsule (referred to as "light-sensitive microcapsule" hereinafter) and the other component is contained in other microcapsule, and a mean particle size of the microcapsule containing the other component is larger than that of the light-sensitive microcapsule.

The microcapsule having larger mean particle size is ruptured easily at relatively low pressure as compared with the light-sensitive microcapsule. The present inventor has found that the component oozing from the ruptured microcapsule is easily brought into contact with the component in the smaller microcapsule, whereby the color formation proceeds readily. Accordingly, a clear color image having a high contrast can be readily obtained. Further, the image formation procedure can be simplified at a relatively low pressure. Furthermore, the light-sensitive material of the present invention is improved in preservability, since two components are separated from each other by being contained in different microcapsules.

The light-sensitive material of the invention can be utilized in a system which employs a color former and a color developer as two components which give a color in contact with each other, under the condition that the color former is contained in the light-sensitive microcapsule and the color developer is contained in other microcapsule.

DETAILED DESCRIPTION OF THE INVENTION

The light-sensitive material of the present invention comprises a light-sensitive layer containing a light-sensitive component such as a silver halide, a polymerizable compound and a reducing agent, and two components which give a color in contact with each other, and a support on which the light-sensitive layer is provided.

Examples of the components which develop to give a color in contact with other components include various compounds capable of developing a color through certain reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in pre-print of the seminer promoted by the Society of Kinki Chemical Industry, "The Newest Chemistry of Coloring Matter - Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

As other example of the system which give a color in contact with two or more component, a system in which the color formation is accelerated by heating can be employed. In that case, the light-sensitive material is necessary to be heated simultaneously or immediately thereafter rupturing the microcapsule by pressing.

In the light-sensitive material of the present invention, the color formation system comprising the color former and the color developer is preferred. In the color formation system, a triarylmethane group, a diphenylmethane group, a xanthene group, a thiazine group and a spiropyrane group can be used as a color former. Concrete examples thereof are described in Japanese Patent Provisional Publication No. 55(1980)-27253. Among them, the triarylmethane group and the xanthene group are preferred with respect to reducing in occurrence of fog and giving a high density.

Concrete examples of the color formers include Crystal Violet lactone, 3-diethylamino-6-chloro-7-($\beta$-ethoxyethylamino)fluorane, 3-diethylamino-6-methyl-7-anilinofluorane, 3-triethylamino-6-methyl-7anilinofluorane, 3-cyclohexylmethylamino-6-methyl-7-anilinofluorane and 3-diethylamino-7-o-chloroanilinofluorane. The color formers can be used singly or in combination.

In the case that the above described color formers are used, a phenol compound, an organic acid or a metal salt thereof, a p-hydroxybenzoic acid ester and an acid clay can be used as the color developer.

Concrete examples of the phenol compounds include 4,4-isopropylidene-diphenol (bisphenol-A), p-tert-butylphenol, 2,4-dinitrophenol, 3,4-dichlorophenol, 4,4'-methylene-bis(2,6-di-tert-butylphenol), p-phenylphenol, 1,1-bis(4-hydroxyphenyl)-2-ethylhexane, 2,2-bis(4-hydroxyphenyl)buthane, 2,2'-methylene bis(4-tert-butylphenol), 2,2'-methylene-bus ($\alpha$-phenyl-p-cresol)-thiodiphenol, 4,4'-thio bis (6-tert-butyl-m-cresol)sulfonyldiphenol, p-tert-butylphenol-formalin condensate and p-phenylphenol formalin condensate.

Concrete examples of the organic acids or metal salts thereof include phthalic acid, phthalic anhydride, maleic acid, benzoic acid, gallic acid, o-toluic acid, salicylic acid, 3-tert-butylsalicylic acid, 3,5-di-tert-butylsalicylic acid, 5-$\alpha$-methylbenzylsalicylic acid, 3,5-($\alpha$-methylbenzyl)salicylic acid and 3-tert-octylsalicylic acid, and their zinc salts, lead salts, aluminum salts, magnesium salts and nickel salts. Among them, the salicylic acid derivatives, and zinc salts and aluminum salts thereof are preferred with respect to developing a color, fastness of color image and preservation of the light-sensitive material.

Examples of the p-hydroxybenzoic acid esters include ethyl -p-hydroxybenzoate, butyl p-hydroxybenzoate, heptyl p-hydroxybenzoate and benzyl p-hydroxybenzoate.

In the case that the color developer which develops a color after melting at a certain temperature, the color developer is preferably added in the form of an eutectic mixture with a thermoplastic compound having a low melting point, or under the condition that a compound having a low melting point is in contact with the surface of the color developer grain.

Examples of the compounds having a low melting point include higher fatty acid amides such as stearic acid amide, eruic acid amide, palmitic acid amide and ethylene bisstearoamide; waxes of higher fatty acid esters; phenyl benzoate derivatives; aromatic ether derivatives; and urea derivatives.

As other color formation systems employing the color former and color developer, phenolphthalein, fluorecein, 2',4',5',7'-tetrabromo-3,4,5,6-tetrachlorofluorecein, tetrabromophenolphthalein, Eosine, and 2-naphthol phenolphthalein can be used as a color former.

Examples of the color developer in the case that the above color formers are employed include nitro-containing compounds such as inorganic and organic ammonium salts, amine, amide, urea, thiourea and their derivatives, thiazoles, pyrroles, pyrimidines, piperazines, guanidines, indoles, imidazoles, imidazolines, triazols, morpholines, piperadines, amidines, and pyrridines.

Concrete examples of the nitro-containing compounds include ammonum acetate, tricyclohexylamine, tribenzylamine, octadecylbenzylamine, stearylamine, allylurea, thiourea, methylthiourea, allylthiourea, ethylene-thiourea, 2-benzylimidazole, 4-phenylimidazole, 2-phenyl-4-methyl-imidazole, 2-undecyl-imidazoline, 2,4,5-trifuryl-2imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidine trichloroacetate, N,N'-dibenzylpiperazine, 4,4'-dithiomorpholine, morpholinium trichloroacetate, 2-aminobenzothiazole and 2-benzoylhydrazino-benzothiazole.

In the light-sensitive material of the present invention, one of the components which give a color in contact with each other, the silver halide and the polymerizable compound (described hereinafter) are together contained in one microcapsule (i.e., light-sensitive microcapsule) and the other component is contained in other microcapsule. The microcapsule containing the other component is so prepared as to have a mean particle size larger than the light-sensitive microcapsule.

In that case, the mean particle size of the microcapsule containing the other component is preferably in the range of 1.4 to 2.5 times as much as that of the light-sensitive microcapsule. Accordingly, the microcapsule containing the other component is easier to rupture than the light-sensitive microcapsule, whereby the color formation can be accelerated.

In the case that the color former and color developer are used in combination as the color formation system, it is preferred that the color former, the silver halide and the polymerizable compound are contained in the light-sensitive microcapsule, and the color developer is contained in other microcapsule.

The mean particle size of the microcapsule can be adjusted by changing stirring condition at the stage of the process for the preparation of the microcapsules (described hereinafter). There is no specific limitation with respect to the shell material of the microcapsule (described hereinafter). In the present invention, the shell material of the microcapsule is preferably made of urea-aldehyde resin. In the case that the color developer is contained in the microcapsule, the color developer is preferably dissolved in a compound having a miscibility with the polymerizable compound, and more preferably is dissolved in compound similar to the polymerizable compound. The oil absorptive white pigment can be used as the color developer to disperse and fix the components contained in the microcapsule.

Further, two or more kinds of the microcapsules differing from each other with respect to at least one of the silver halide, polymerizable compound and color image forming substance can be employed. Futhermore, three or more kinds of the microcapsules differing from each other with respect to the color image forming substance is preferably employed to form a full color image.

In light-sensitive material of the present invention, the color former is preferably used in an amount of from 0.5 to 50 parts by weight, and more preferably form 2 to 20 parts by weight, per one part by weight of the polymerizable compound. The color developer is preferably used in an amount of from 10 to 100 parts by weight per one part by weight of the color former.

The light-sensitive material employing two or more components which give a color in contact with each other is described in Japanese Patent Provisional Publication No. 61(1986)-73145.

The silver halide, reducing agent, the polymerizable compound and the support which constitute the light-sensitive material of the invention are described below. Thus composed material is referred herein to as "light-sensitive material".

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenos, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductonres, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either an area where a latent image of the silver halide has been formed or an area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publications Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22–31 Dec. 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

The polymerizable compound employable for the light-sensitive material of the invention are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ringopening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that a heat development is unilized in the use of the light-sensitive material, the support preferably is resistant to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610. A surface of a paper support preferably has a low water absorptiveness of not more than 3 g/m$^2$ which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 mm$^2$ at pressure of 567 g. Furthermore, a paper support preferably has a pH value in the range of 5 to 9.

The light-sensitive material of the present invention comprising a light-sensitive layer containing at least the polymerizable compound and one component which gives a color contained in the microcapsule, and another component which gives a color contained in another microcapsule.

The term "components contained in microcapsules" in the present specification means core materials which constitute microcapsules and/or components contained in the shell materials.

In the light-sensitive material of the invention, the silver halide and polymerizable compound are contained in microcapsules to form light-sensitive microcapsules which are dispersed in the light-sensitive layer. The reducing agent is preferably contained in the light-sensitive microcapsules. It is preferred that five or more silver halide grains are contained in the light-sensitive microcapsules. Further, the silver halide grains are preferably arranged in the shell of the microcapsules.

Various embodiments of the light-sensitive materials, optional components which may be contained in the light-sensitive layer, and auxiliary layers which may be optionally arranged on the light-sensitive materials are described below.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, a complex resin containing polyurethane resin and polyester resin.

In the case that the shell material is composed of a condensed aldehyde resin, the residual aldehyde preferably is not more than 5 mole based on the amount of the reducing agent.

The microcapsules which contains five or more silver halide grains are preferably more than 50% by weight based on the total amount of the microcapsules. The silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The mean size of the microcapsule preferably ranges from 0.5 to 50 μm, more preferably 1 to 25 μm, most preferably 3 to 20 μm. The amount of the microcapsules having a particle size of not larger than one sixth part of the average particle size preferably is not more than 1 volume % of the total amount of the microcapsules. Further, the amount of the microcapsules having a particle size of not smaller than twice as large as the average particle size is not more than 1 volume % of the total amount of the microcapsules. Further more, the proportion of an average thickness of the shell of the microcapsules to the average particle size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains, even and uniform image can be obtained.

The light-sensitive layer can further contain optional components such as sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, anti-irradiation dyes or pigments, matting agents, antismudging agents, plasticizers, water releasers, binders, photo polymerization initiator, solvent of the polymerizable compound and water soluble vinyl polymers.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Examples of the radical generators include triazenesilver, silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The base or base precursor can be arranged outside of the microcapsules containing the components of the light-sensitive layer, such as silver halide and polymerizable compound. In this case, the base or base precursor preferably is a hydrophobic compound having melting point of 80 to 180° C. in the form of solid particles.

A base precursor can be used in combination with a catalyst for decomposing the base precursor. For example, a propiolate type base precursor can be used in combination with a catalyst such as silver, copper, a silver compound and a copper compound. Further, the propiolate type base precursor or a sulfonylacetate type base precursor can be used in combination with a hot-melt solvent, which functions as a catalyst for decomposing the base precursor.

In the light-sensitive material, the silver halide, the reducing agent, the polymerizable compound and the color image forming substance are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under a condition that the base or base precursor is dissolved or dispersed in an aqueous solution of a water retention agent, or under a condition that the base or base precursor is adsorbed on solid particles. The base or base precursor contained in the microcapsules preferably has a melting point in the range of 70° to 210° C.

The base or base precursor can be contained in a layer different from the light-sensitive layer. Further, the base or base precursor can be contained in a porous support.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quarternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26–28 (Dec. 1976). The hot-melt solvent is preferably used in an amount of from 0.5 to 50% by weight, and more preferably from 1 to 20% weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles such as particles of talc, kaolin, bentonite, agalmatolite, zinc oxide, titanium dioxide or alumina described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

The photo polymerization initiators can be contained in the light-sensitive layer of the light-sensitive material for the purpose of polymerization of unpolymerized polymerizable compound.

In the case that the solvent of the polymerizable compound is used, the solvent is preferably contained in a microcapsule which is different from the light-sensitive microcapsule.

In the case that the water soluble vinyl polymer is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9–15 (June 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer). In the present invention, a undercoating layer preferably is provided between the support and the light-sensitive layer.

Examples and usage of the other auxiliary layers are also described in the above-mentioned publications and applications concerning the light-sensitive material.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water soluble iridium salt, e.g., iridium (III) or (IV) chloride, or ammonium hexachloroiridate, or a water soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added in the course of the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound is used as the medium for preparation of the liquid composition containing another component of the light-sensitive layer. For example, the silver halide (including the silver halide emulsion), the reducing agent and one of the components which give a color in contact with each other (e.g., color former) can be dissolved, emulsified or dispersed in the polymerizable compound to prepare the light-sensitive material. Especially, one of the components is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Instead of employing the above polymer, the light-sensitive composition can be prepared by dispersing the microcapsules having the silver halide emulsion as core material in the emulsion of the polymerizable compound.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

Examples of the process for preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publications Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

A microcapsule dispersion containing the other component (e.g., color developer) is prepared in the same manner as described above. To the light-sensitive microcapsule dispersion is added the microcapsule dispersion containing the other component to obtain a coating solution for the preparation of the light-sensitive layer.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be employed in the image-wise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

Instead of bases or base precursors contained in the light-sensitive material, the development can be proceeds simultaneously or thereafter the bases or base precursors added to the light-sensitive layer. A base sheet (a sheet in which a base is contained) is preferably employed.

During the above development process, a polymerization compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process.

Especially, when the color former is contained in the light-sensitive microcapsule and the color developer is contained in other microcapsule, the microcapsule containing the color developer is ruptured easier than the light-sensitive microcapsule containing the color former. The color formation proceeds very smoothly.

Various image recording apparatus can be used for the image-forming method. An example of the apparatus comprises an exposure device for imagewise exposing a light-sensitive material to form a latent image, a heat development device for fixing the area corresponding to the latent image, a transfer device for pressing the developed light-sensitive material on an image-receiving material. Another example of the apparatus comprises an fixing device for irradiating, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 3,000 ml of water were dissolved 40 g of gelatin and 23.8 g of potassium bromide, and the resulting gelatin solution was kept at 50° C. To the gelatin solution, 200 ml of an aqueous solution containing 32.3 g of silver nitrate was added over a period of 15 minutes while stirring. To the solution, 100 ml of an aqueous solution containing 1.2 g of potassium iodide was added over a period of 2 minutes to obtain silver iodobromide emulsion. After the emulsion was adjusted to a pH for sedimentation, excess salt were removed, and the emulsion was adjusted to a pH 6.0. The yield of the emulsion was 400 g.

Preparation of light-sensitive composition

In a mixture of 90 g of trimethylolpropane triacrylate (Aronix M-309, tradename of Toa Gosei Chemical Industry Co., Ltd.) and 10 g of dipentaerythritol hexacrylate (Aronix M-400, tradename of Toa Gosei Chemical Industry Co., Ltd.) were dissolved 0.40 g of the following copolymer and 8.0 g of Pargascript Red I-6-B (tradename of Ciba-Geigy).

(Copolymer)

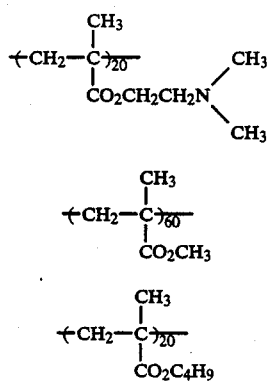

To 18.00 g of the resulting solution were added 1.29 g of the following reducing agent (I), 1.25 g of the following reducing agent (II), 0.2 g of 1% ethyl acetate solution of the following thiol derivative (antifogging agent) and 0.36 g of Emulex NP-8 (tradename of Nippon Emulsion Co., Ltd.), and to the mixture was further added 4.0 g of methylene chloride and the resulting mixture was made uniform.

(Thiol derivative)

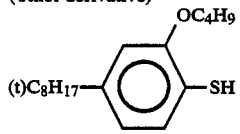

(Reducing agent (I))

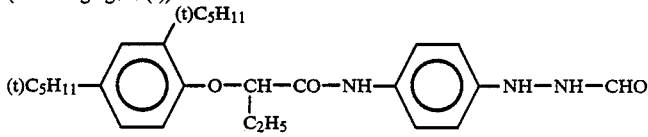

(Reducing agent (II))

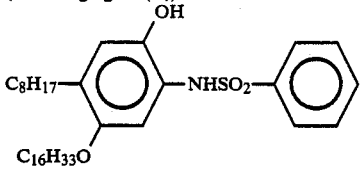

Further, to the resulting mixture was added 4.06 g of the silver halide emulsion, and the mixture was stirred at 15,000 r.p.m. for 3 minutes to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

The 72.5 g of the aqueous emulsion were added 8.32 g of 40% aqueous solution of urea, 2.82 g of 11.3% aqueous solution of resorcinol, 8.56 g of 37% aqueous solution formaldehyde and 3.0 g of 8.0% aqueous solution of ammonium sulfate in order, and the mixture was heated at 60° C. for 2 hours while stirring. After the mixture was adjusted to a pH of 7.0 using 10% aqueous solution of sodium hydroxyde, and was further added 3.62 g of 30.9% aqueous solution of sodium hydrogen sulfite to obtain a dispersion containing light-sensitive microcapsules (mean particle diameter: 5 μm).

Preparation of color developing composition

To 100 g of trimethylolpropane triacrylate (Aronix M-309, tradename of Toa Gosei Chemical Industry Co., Ltd.) was added 35 g of zinc 3,5-α-methylbenzylsalicylate to obtain a color developing composition.

Preparation of microcapsule containing color developer

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, 30 g of the color developing composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution formaldehyde and 3.0 g of 8.0% aqueous solution of ammonium sulfate in order, and the mixture was heated at 60° C. for 2 hours while stirring. After the mixture was adjusted to a pH of 7.0 using 10% aqueous solution of sodium hydroxyde, and was further added 3.62 g of 30.9% aqueous solution of sodium hydrogen sulfite to obtain a microcapsule containing color developer (mean particle diameter: 7 μm).

Preparation of light-sensitive material

To 125 g of water was added 11 g of 40% aqueous solution of sodium hexametaphosphate, and was further added 82 g of 55% slurry of calcium carbonate, followed by coarsely dispersing in a mixer. The coarse dispersion was then finely dispersed in Dynomil dispersing device. To 200 g of the resulting dispersion were added 6 g of 50% of latex of SBR (styrene-butadiene rubber) and 55 g of 8% aqueous solution of polyvinyl alcohol, and the resulting mixture was made uniform to otain a coating solution for the preparation of a undercoating layer. The mixture was then uniformly coated on a baryta paper having a basis weight of 43 g/m² to give a layer having a wet thickness of 30 μm and dried to obtain a undercoating layer.

To 10.0 g of the light-sensitive microcapsule dispersion were added 10.0 g of microcapsule dispersion containing color developer, 1.0 g of 5% aqueous solution of Emulex NP-8 (tradename of Nippon Emulsion Co., Ltd.) and 3.7 g of 10% solution (solvent: water/ethanol=50/50 as volume ratio) of guanidine trichloroacetate to prepare a coating solution for the preparation of the light-sensitive layer. The coating solution was coated on the undercoating layer using a wire bar of #40 to give a layer having a wet thickness of 70 μm and dried at 40° C. for 30 minutes to obtain a light-sensitive material (I).

EXAMPLES 2 & 3 and COMPARISON EXAMPLES 1 & 2

Light-sensitive materials (II), (III), (IV) and (V) were prepared in the same manner as in Example 1 except that each of the microcapsule dispersions was prepared under the stirring condition indicated in Table 1.

TABLE 1

| Light-sensitive material | Stirring condition (r.p.m.) | (min.) | Average particle size (μm) |
|---|---|---|---|
| (I) | 7,000 | 2 | 7 |
| (II) | 5,000 | 2 | 9 |
| (III) | 3,000 | 4 | 12 |
| (IV) | 10,000 | 2 | 3 |
| (V) | 8.000 | 2 | 5 |

Evaluation of light-sensitive materials

Each of the light-sensitive materials prepared in Examples 1 & 2 and Comparison Examples 1 & 2 was image-wise exposed to light using a tungstem lamp at 5,000 lux for 1 second through a filter in which density has been continuously changed, and then heated on a hot plate at 125° C. for 40 seconds. Each of the exposed and heated light-sensitive materials was then passed through a press roll at pressure of 250 kg/cm², 500 kg/cm² and 750 kg/cm² to obtain a magenta positive image on the light-sensitive material. The density of the obtained magenta positive image was measured using Macbeth's reflection densitometer.

The results are set forth in Table 2 (at pressure of 250 kg/cm²), Table 3 (at pressure of 500 kg/cm²) and Table 4 (at pressure of 750 kg/cm²). In Tables 2 to 4, "Particle size of microcapsule" means a mean particle size of the microcapsule containing color developer.

TABLE 2

| Light-sensitive material | Particle size of microcapsule | Minimum density | Maximum density |
|---|---|---|---|
| (I) | 7 μm | 0.07 | 1.22 |
| (II) | 9 μm | 0.06 | 1.23 |
| (III) | 12 μm | 0.07 | 1.35 |
| (IV) | 3 μm | 0.06 | 0.83 |
| (V) | 5 μm | 0.07 | 1.07 |

TABLE 3

| Light-sensitive material | Particle size of microcapsule | Minimum density | Maximum density |
|---|---|---|---|
| (I) | 7 μm | 0.07 | 1.33 |
| (II) | 9 μm | 0.07 | 1.40 |
| (III) | 12 μm | 0.07 | 1.41 |
| (IV) | 3 μm | 0.06 | 0.92 |
| (V) | 5 μm | 0.06 | 1.11 |

TABLE 4

| Light-sensitive material | Particle size of microcapsule | Minimum density | Maximum density |
|---|---|---|---|
| (I) | 7 μm | 0.08 | 1.38 |
| (II) | 9 μm | 0.07 | 1.41 |
| (III) | 12 μm | 0.08 | 1.42 |
| (IV) | 3 μm | 0.07 | 1.00 |
| (V) | 5 μm | 0.07 | 1.18 |

It is apparent from the results in Table 2 to 4, the light-sensitive materials (I) to (III) according to the present invention can give a clear image having a high density even at low pressure.

I claim:

1. A light-sensitive material comprising a light-sensitive layer containing a silver halide grain, an ethylenically unsaturated polymerizable compound or a polymerizable compound which polymerizes by ring opening, a reducing agent, two components which give a color in contact with each other and a support, wherein one of the components, the silver halide and the polymerizable compound are contained together in a microcapsule to form a light-sensitive microcapsule and the other component is contained in other microcapsule, and a mean particle size of the microcapsule containing the other component is larger than that of the light-sensitive microcapsule.

2. The light-sensitive material as claimed in claim 1, wherein the mean particle size of the microcapsule containing the other component is in the range of from 1.4 to 2.5 times as much as that of the light-sensitive microcapsule.

3. The light-sensitive material as claimed in claim 1, wherein the light-sensitive microcapsule contains a color former as the one component, and the other microcapsule contains a color developer as the other component.

4. The light-sensitive material as claimed in claim 1, wherein the light-sensitive microcapsule contains a color former as the one component, and the color former is triarylmethane or xanthene.

5. The light-sensitive material as claimed in claim 1, wherein the other microcapsule further contains a compound having a miscibility with the polymerizable compound.

6. The light-sensitive material as claimed in claim 1, wherein the light-sensitive microcapsule contains a color former as the one component, and the color former is contained in the amount of 0.5 to 50 weight % per the amount of the polymerizable compound.

7. The light-sensitive material as claimed in claim 1, wherein the light-sensitive microcapsule contains a color former as the one component and the other microcapsule contains a color developer as the other component, in which the amount of the color former is in the range of from 10 to 100 weight % per the amount of the color developer.

8. The light-sensitive material as claimed in claim 1, wherein the polymerizable compound has a viscosity of not lower than 100 cP at 25° C.

9. The light-sensitive material as claimed in claim 1, wherein the shell of the microcapsules is made of a urea-formaldehyde resin.

10. The light-sensitive material as claimed in claim 1, wherein the support is made of a paper having such a smooth surface on the side facing the light-sensitive layer that its smoothness value in terms of the Bekk Smoothness is not less than 300 seconds, said Bekk smoothness being determined using Bekk Tester.

11. The light-sensitive material as claimed in claim 1, wherein the reducing agent is contained in the light-sensitive microcapsule.

12. The light-sensitive material as claimed in claim 1, wherein a undercoating layer is provided between the support and the light-sensitive layer.

* * * * *